United States Patent

Frese et al.

[11] Patent Number: 5,814,993
[45] Date of Patent: Sep. 29, 1998

[54] MAGNET ARRANGEMENT FOR A DIAGNOSTIC NUCLEAR MAGNETIC RESONANCE APPARATUS

[75] Inventors: Georg Frese, Herzogenaurach; Horst Siebold, Effeltrich, both of Germany

[73] Assignee: Siemens Aktiengesellschaft, Munich, Germany

[21] Appl. No.: 819,777

[22] Filed: Mar. 18, 1997

[30] Foreign Application Priority Data

Mar. 28, 1996 [DE] Germany .................. 196 12 421.2

[51] Int. Cl.⁶ .................................................. G01V 3/00
[52] U.S. Cl. .................................... 324/319; 324/320
[58] Field of Search .................... 324/320, 319, 324/318, 322; 128/653.5; 335/299, 296

[56] References Cited

U.S. PATENT DOCUMENTS

| | | | |
|---|---|---|---|
| 4,689,591 | 8/1987 | McDougall | 324/319 |
| 4,701,736 | 10/1987 | McDougall et al. | 335/299 |
| 5,256,970 | 10/1993 | Ham et al. | 324/319 |
| 5,365,927 | 11/1994 | Roemer et al. | 128/653.2 |
| 5,389,879 | 2/1995 | Pulyer | 324/318 |

FOREIGN PATENT DOCUMENTS

| | | |
|---|---|---|
| 0 187 691 | 7/1986 | European Pat. Off. . |
| 0 400 922 | 12/1990 | European Pat. Off. . |
| 0 766 094 | 9/1996 | European Pat. Off. . |
| WO 90/05369 | 5/1990 | WIPO . |

*Primary Examiner*—Louis M. Arana
*Attorney, Agent, or Firm*—Hill & Simpson

[57] ABSTRACT

A magnet arrangement for a diagnostic nuclear magnetic resonance apparatus has a first system for generating a uniform magnetic field in a first imaging volume, the first imaging volume being arranged inside the first system, and a second system for generating a uniform magnetic field in a second imaging volume is in interactive connection with the first system. The second imaging volume is arranged between the first system and the second system.

11 Claims, 1 Drawing Sheet

MAGNET ARRANGEMENT FOR A DIAGNOSTIC NUCLEAR MAGNETIC RESONANCE APPARATUS

BACKGROUND OF THE INVENTION

1. Field of the Invention

The present invention is directed to a magnet arrangement for a diagnostic magnetic resonance apparatus.

2. Description of the Prior Art

U.S. Pat. No. 5,365,927 discloses a magnet arrangement which generates a uniform magnetic field in an imaging volume. A classic, superconductive magnet arrangement is described, which surrounds a cylindrical patient tube. The superconductive magnet generates a uniform and chronologically consistent main magnetic field inside the patient tube in an approximately spherical imaging volume. The diameter of the imaging volume typically lies in the range of 50 cm. Access to the imaging volume is limited to the end-face openings in the patient tube. Interventional techniques such as, for example, surgical operations at the patient assisted by magnetic resonance imaging (MRI), however, cannot be implemented. Further, there is a risk of claustrophobic reactions on the part of the patient.

Open magnet systems, in addition to the patient access, provide a lateral access to the imaging volume for a physician or examining person. An open magnet system is also disclosed in U.S. Pat. No. 5,365,927. Open magnet systems generally have the disadvantage that the imaging volume defined by the size of the uniformed magnetic field is smaller compared to the classic systems. This leads to a limited imaging, particularly because of a reduced signal-to-noise ratio, longer measuring times, and limitations in the applicability of pulse sequences. Open systems are usually low-field systems with principal magnetic field strengths of 0.05 T through 0.5 T, since larger volumes must usually be filled with the field.

European Patent Application 0 400 922 discloses a magnet system for a nuclear magnetic resonance apparatus that has two axially spaced and differently constructed sub-systems. The two sub-systems function together to generate a largely uniform magnetic field in an imaging or working volume that lies between the sub-systems. The distance of the two sub-systems from one another can be selected such that an access to the imaging volume is possible transversely relative to the spacing between them.

U.S. Pat. No. 4,701,736 discloses a magnet system for a nuclear magnetic resonance apparatus having a number of coils arranged inside one another with which a uniform magnetic field can be generated in an axially offset imaging volume.

European Application 0 187 691 discloses asymmetrical magnet systems that have an axially offset imaging volume with a uniform magnetic field.

SUMMARY OF THE INVENTION

An object of the present invention is to provide a magnet arrangement for a diagnostic nuclear magnetic resonance apparatus that, first, meets high demands made of the imaging power and, second, assists interventional techniques.

This object is achieved in a magnetic arrangement wherein second means for generating a uniform magnetic field in a second imaging volume are in interactive connection with a first means for generating a uniform magnetic field in a first imaging volume, with the second imaging volume disposed between the first means and the second means. The first means for generating a uniform magnetic field in the first imaging volume have a double function insofar as they also contribute to the uniform magnetic field in the second imaging volume. The inventive magnet arrangement establishes the pre-conditions for an unrestricted imaging in the first, large imaging volume and a largely unimpeded access for an examining person to the second, small imaging volume. Compared to a conventional nuclear magnetic resonance apparatus, a nuclear magnetic resonance apparatus based on the inventive magnet arrangement only requires a second gradient coil system, and possibly further radio-frequency antennas; the measuring and evaluation systems can be used for both imaging volumes. Systems that have already been installed can be reequipped (retrofitted) so that a second imaging volume employable for interventional techniques is made available in addition a "normal" imaging volume.

The second means generate a field gradient in an axial direction in the first imaging volume that can be passively or actively compensated with known methods (passive or active shim). In an embodiment, the electromagnet coils of the first means for generating a uniform magnetic field are fashioned to generate ampere-windings that becomes greater with increasing distance of the electromagnet coils from the second imaging volume. The ampere-windings can be realized by a variation of the number of turns of the electromagnet coils or by excitation with currents of different strengths.

In another embodiment, a patient bed is arranged introducible into the first or second imaging volume.

DESCRIPTION OF THE PREFERRED EMBODIMENTS

Figure 1:
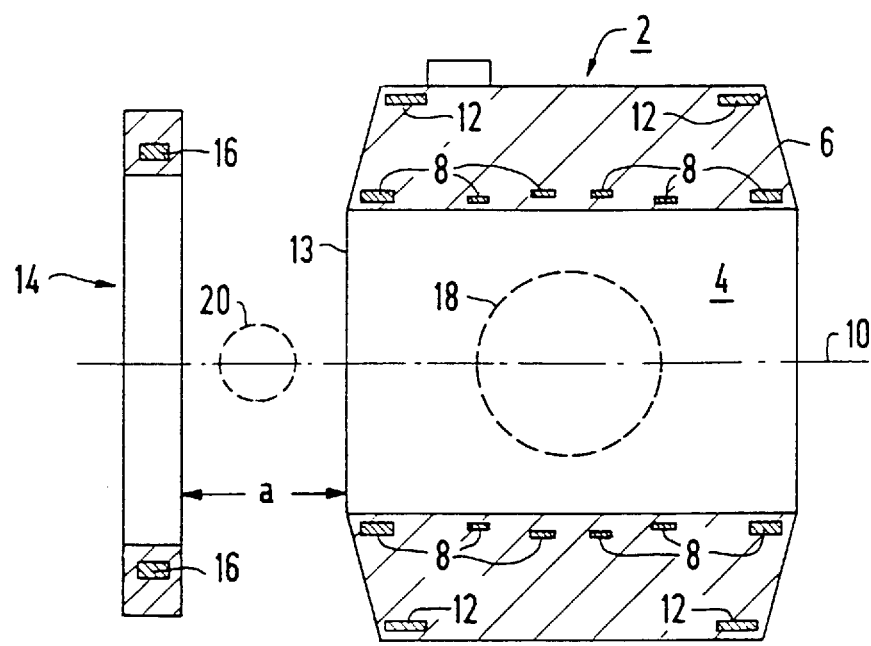
FIG. 1 is a sectional view of a magnet arrangement with two imaging volumes constructed in accordance with the principles of the present invention.

In a sectional view, FIG. 1 shows a side view of a magnet arrangement for a diagnostic nuclear magnetic resonance apparatus. A first magnet system corresponds in terms of structure to a traditional superconductive magnet with a cylindrically fashioned inside space 4. For example, the inside space 4 has a clear diameter of about 1 meter and a length of approximately 1.40 meters. Gradient coils, radio-frequency antennas and patient support devices (none shown here) are built into the inside space 4. The first magnet system 2 includes annular electromagnet coils 8 arranged in a cryostat 6 and which have respective coil axes lie in a symmetry axis 10 of the magnet arrangement. An active shielding in the form of shielding coils 12 is provided for partial shielding of the magnetic field generated by the electromagnet coils 8 at the outside space of the magnet system 2. Two shielding coils 12 are arranged here on a radius that is larger compared to the electromagnet coils 8; the coil axes of the shielding coils 12 likewise lies on the symmetry axis 10 of the magnet system 2.

A second magnet system 14 having an annular electromagnet coil 16 is arranged at a distance "a" of about 50 cm through 60 cm from an end face 13 of the magnet system 2. The mid-point of the electromagnet coil 16 likewise lies on the symmetry axis 10. Patient access directions are preferably aligned parallel to the symmetry axis 10.

The magnet coils 8, 12 and 16 are connected to power supplies (not shown here) that supply the currents required for building up the magnetic fields. The currents thereby flow in the electromagnet coils 8 and 16 isodirectionally around the axis 10, whereas the currents in the electromagnet coil 12 flow in the opposite direction.

A disturbing field gradient in the inside space 4 of the first magnet system 2 in the axial direction generated by second magnet system 14 is compensated here by an appropriate dimensioning and excitation of the electromagnet coils 8. Those axial positions of the electromagnet coils 8, which they would have had in the first magnet system 2 if second magnet system 14 were not present, are thus recreated. The compensation of the field gradients ensues such that amperewindings respectively generated by the electromagnet coils 8 increase with increasing axial distance of the electromagnet coils 8 from the second magnet system 14. Given identical excitation current through all electromagnet coils 8, thus, the number of turns of the individual electromagnet coils 8 increases with increasing axial distance from the second magnet system 14. The magnet arrangement can then generate a uniform magnetic field in a first, larger imaging volume 18 and in a second, smaller imaging volume 20. The first imaging volume 18 is located in the inside space 4, as in the case of a conventional superconductive magnet system, whereas the second imaging volume is arranged between the two magnet systems 2 and 14 and is also freely accessible from the side. The direction of the uniform magnet field is the same in both imaging volumes 18 and 20 and parallel to the symmetry axis 10. The field strength is higher in the first imaging volume 18 than in the second imaging volume 20.

Figure 2:
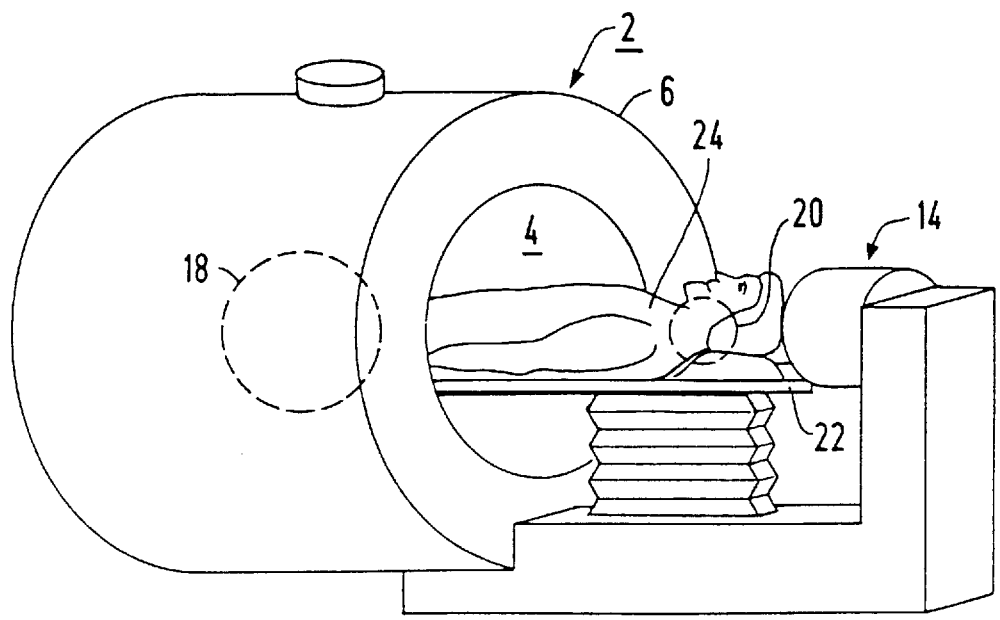
FIG. 2 shows a version of the magnet arrangement of FIG. 1 in a perspective view.

FIG. 2 shows a perspective view of a nuclear magnetic resonance apparatus on the basis of a further embodiment of the inventive magnet arrangement with which uniform magnetic fields can be generated in two separate imaging volumes 18 and 20. The second magnet system 14 is implemented as a pole shoe that, compared to the embodiment shown in FIG. 1, offers improved access to the second imaging volume 20. The pole shoe arrangement 14 preferably has permanent magnets as magnetic drives. Using a displaceable patient bed 22, a patient 24 to be examined or to be treated can be positioned in the first imaging volume 18 as well as—without further repositioning—in the second imaging volume 20 for producing images.

The magnet arrangement shown in FIG. 2 with the pole shoe embodiment of the second magnet system 14 is particularly suitable for MRI-guided interventions in the head or foot region of the patient 24. By contrast thereto, the embodiment of the magnet arrangement shown in FIG. 1 also allows MRI-guided interventions in the middle region of the patient 24 because the second magnet system 14 there represents no impediment to reaching the patient in the axial direction.

Due to their flat structure, the second coils disclosed in U.S. Pat. No. 5,198,769 are particularly suited for use as gradient coils for generating the transverse gradient fields in the second imaging volume 20 of the invention arrangement, as is required for the spatial resolution. As in a conventional apparatus, the gradient field in the axial direction can be generated by two coils that are spaced axially from one another and that have annular windings.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnet arrangement for a diagnostic nuclear magnetic resonance apparatus comprising first means for generating a uniform magnet field in a first imaging volume with the first imaging volume disposed inside the first means, and second means for generating a uniform magnet field in a second imaging volume in interactive connection with the first means with said second imaging volume disposed between the first means and the second means said first and second imaging volumes being separate and independent from each other.

2. A magnet arrangement as claimed in claim 1, wherein the first and second means are disposed along an axis.

3. A magnet arrangement as claimed in claim 2, wherein the first and second imaging volumes are arranged along said axis.

4. A magnet arrangement as claimed in claim 2, wherein the first and second means respectively generate their uniform magnetic fields in the first and second imaging volumes in a same direction.

5. A magnet arrangement as claimed in claim 2, wherein the first and second means respectively generate their uniform magnetic fields in the first and second imaging volumes parallel to said axis.

6. A magnet arrangement as claimed in claim 2 wherein the first means comprise a plurality of series-arranged electromagnet coils with respective coil axes; with said coil axes and said axis coinciding.

7. A magnet arrangement as claimed in claim 6, wherein the electromagnet coils generate ampere-windings, which becomes greater with increasing distance of the electromagnet coils from the second imaging volume.

8. A magnet arrangement as claimed in claim 6, further comprising the electromagnet coils are arranged as superconductive magnets.

9. A magnet arrangement as claimed in claim 1, wherein the second means comprises an electromagnet coil.

10. A magnet arrangement as claimed in claim 1, wherein the second means comprise permanent magnets.

11. A magnet arrangement as claimed in claim 1, further comprising a patient bed and means for displacing said patient bed into the first or second imaging volume.

\* \* \* \* \*